United States Patent
Vinje et al.

(10) Patent No.: US 10,581,443 B2
(45) Date of Patent: Mar. 3, 2020

(54) METHOD AND APPARATUS FOR OFFSET CORRECTION IN SAR ADC WITH REDUCED CAPACITOR ARRAY DAC

(71) Applicant: Microchip Technology Incorporated, Chandler, AZ (US)

(72) Inventors: Anders Vinje, Trondheim (NO); Ivar Løkken, Trondheim (NO)

(73) Assignee: Microchip Technology Incorporated, Chandler, AZ (US)

( * ) Notice: Subject to any disclaimer, the term of this patent is extended or adjusted under 35 U.S.C. 154(b) by 0 days.

(21) Appl. No.: 16/173,289

(22) Filed: Oct. 29, 2018

(65) Prior Publication Data

US 2019/0131986 A1 May 2, 2019

Related U.S. Application Data

(60) Provisional application No. 62/578,608, filed on Oct. 30, 2017.

(51) Int. Cl.
*H03M 1/06* (2006.01)
*H03M 1/10* (2006.01)
*H03M 1/46* (2006.01)

(52) U.S. Cl.
CPC ....... *H03M 1/0607* (2013.01); *H03M 1/1023* (2013.01); *H03M 1/468* (2013.01)

(58) Field of Classification Search
CPC ... H03M 1/0607; H03M 1/1023; H03M 1/468
(Continued)

(56) References Cited

U.S. PATENT DOCUMENTS

| 4,989,002 A | 1/1991 | Tanq .......................... 341/120 |
| 8,023,001 B2 * | 9/2011 | Mizuta ................. H04N 1/4076 341/118 |

(Continued)

OTHER PUBLICATIONS

Kvalø, Kjetil, "Design of an Analog to Digital Converter with Superior Accuracy/Bandwidth vs. Power Ratio," Master Thesis, Norwegian University of Science and Technology, 96 pages, Jul. 2011
(Continued)

*Primary Examiner* — Brian K Young
(74) *Attorney, Agent, or Firm* — Slayden Grubert Beard PLLC

(57) ABSTRACT

Offset correction in a differential successive approximation register (SAR) analog-to-digital converter (ADC) is accomplished with a capacitor-reduced digital-to-analog converter (DAC) topology to enable offset correction without the need for a dedicated compensation DAC. This eliminates addition analog circuitry and die area. To perform the offset correction, the differential SAR ADC couples together inputs thereof to create an offset voltage, converts the offset voltage into a digital representation thereof, stores the digital representation of the offset voltage in an offset register, and corrects for the offset voltage by generating an offset compensation voltage with the capacitor-reduced array DAC controlled by the digital representation stored in the offset register. The digital representation controls scaling of reference voltages to the reduced capacitor array DAC associated with a least-significant-bit (LSB) of the differential SAR ADC.

20 Claims, 7 Drawing Sheets

(58) Field of Classification Search
USPC .......................................... 341/120, 118, 155
See application file for complete search history.

(56) References Cited

U.S. PATENT DOCUMENTS

| | | | |
|---|---|---|---|
| 9,172,388 B1* | 10/2015 | Stein | H03M 1/0609 |
| 9,479,186 B1* | 10/2016 | Naru | H03M 1/203 |
| 9,537,499 B2* | 1/2017 | Harpe | H03M 1/1033 |
| 2008/0316080 A1 | 12/2008 | Yoshinaga | 341/158 |

OTHER PUBLICATIONS

International Search Report and Written Opinion, Application No. PCT/US2018/058087, 16 pages, dated Feb. 12, 2019.

* cited by examiner

Figure 1 (Prior Technology)

METHOD AND APPARATUS FOR OFFSET CORRECTION IN SAR ADC WITH REDUCED CAPACITOR ARRAY DAC

RELATED PATENT APPLICATION

This application claims priority to commonly owned U.S. Provisional Patent Application Ser. No. 62/578,608; filed Oct. 30, 2017; entitled "Method for Offset Correction in SAR ADC with Reduced Capacitor Array DAC," by Anders Vinje and Ivar Løkken; and is hereby incorporated by reference herein for all purposes.

TECHNICAL FIELD

The present disclosure relates to analog-to-digital converters (ADC) and, more particularly, to offset correction in successive approximation register (SAR) ADCs with reduced capacitor array digital-to-analog conversion (DAC).

BACKGROUND

A successive approximation register (SAR) analog-to-digital converter (ADC) is a type of analog-to-digital converter that converts a continuous analog waveform into discrete digital representations by performing a binary search to converge to the closest quantization level of each sample taken of the analog waveform then providing a digital representations thereof. SAR ADCs are among the most popular ADC architectures, and may be used in, for example, microcontrollers.

An ADC, generally, is expected to make offset-free measurements. Methods for offset calibration include digital offset correction in post-processing, analog offset correction using an offset compensated comparator, and hybrid digital/analog offset correction using a dedicated compensation digital-to-analog convertor (DAC). Digital correction is simplest but has a fundamental limitation in that it limits the ADC's signal range. Analog correction using an offset compensated comparator or hybrid correction using a dedicated correction DAC is therefore widely used, but substantially increases the circuit complexity.

Some solutions for offset calibration include digital offset correction in post-processing, analog offset correction using an offset compensated comparator, and hybrid digital/analog offset correction using a dedicated compensation DAC. Digital correction may be simple but may have a fundamental limitation in that digital correction limits the ADC's signal range. Analog correction using an offset compensated comparator or hybrid correction using a dedicated correction DAC may be used, but these approaches may substantially increase the circuit complexity.

FIG. 1 illustrates three prior technology methods to perform offset correction. FIG. 1(a) shows a circuit for digital offset correction. Digital offset correction, when post processing the output data, is the simplest method, but it limits the range of the ADC since it shifts the whole ADC transfer function, thereby changing its saturation limits. It may include measuring the offset and compensating for it digitally in post-processing.

FIG. 1(b) shows a circuit for analog offset correction. Fully analog offset correction using an offset compensated comparator circumvents the problem with the aforementioned digital offset correction method and is also commonly used, e.g., in the SAR ADC for a microcontroller. Analog correction does not limit the ADC's range. This can be done in the background with extra clock cycles. However, it substantially increases the complexity of the comparator, often increasing its integrated circuit area greatly.

FIG. 1(c) shows a circuit for hybrid analog/digital offset correction. This method uses a hybrid (analog/digital) correction with a separate correction DAC, so the offset can be subtracted after being measured and stored. This also does not limit the ADC's range, but it adds substantial complexity due to the need of a dedicated correction DAC. Hybrid correction may include measuring offset and compensating in the analog domain with the correction DAC.

SUMMARY

Therefore, what is needed is a hybrid analog/digital correction method and apparatus for SAR ADCs that exploit capacitor reduced DAC topology for providing offset correction without requiring a dedicated compensation DAC.

According to an embodiment, a method for offset correction in a successive approximation register (SAR) analog-to-digital converter (ADC) using a reduced capacitor array digital-to-analog converter (DAC) may comprise the steps of: coupling together positive and negative inputs of a SAR ADC; determining a digital representation of an offset voltage of the SAR DAC; storing the digital representation of the offset voltage in an offset register; configuring a reduced capacitor array DAC, that may comprise a plurality of offset correction capacitors, with the stored digital representation of the input offset voltage to provide an offset correction voltage; decoupling the positive and negative inputs of the SAR ADC; coupling a differential voltage to the positive and negative inputs of the SAR ADC; and performing a SAR conversion of the differential voltage while coupling with the offset correction voltage from the reduced capacitor array DAC.

According to a further embodiment of the method, the plurality of offset correction capacitors may be coupled to a plurality of reference voltages selected by the digital representation of the offset voltage stored in the offset register. According to a further embodiment of the method, the plurality of reference voltages may be binary weighted from Vrefp to Vrefn voltages. According to a further embodiment of the method, a common mode voltage Vcm may be about equal to (Vrefp+Vrefn)/2. According to a further embodiment of the method, the plurality of reference voltages may be provided from a series connected resistive voltage divider string coupled between Vrefp and Vrefn. According to a further embodiment of the method, the plurality of offset correction capacitors may comprise N positive offset correction capacitors having top plates coupled together and forming a node Vx, and N negative offset correction capacitors having top plates coupled together and forming a node Vy, where N may be the number of offset voltage correction bits of the reduced capacitor array DAC.

According to a further embodiment of the method, N may be equal to five (5) and may further comprise the steps of: coupling a bottom plate of a first positive offset correction capacitor selectably to Vcm, Vrefp/2 or Vrefn/2; coupling a bottom plate of a first negative offset correction capacitor selectably to Vcm, Vrefn/2 or Vrefp/2; coupling a bottom plate of a second positive offset correction capacitor selectably to Vcm, Vrefp/4 or Vrefn/4; coupling a bottom plate of a second negative offset correction capacitor selectably to Vcm, Vrefn/4 or Vrefp/4; coupling a bottom plate of a third positive offset correction capacitor selectably to Vcm, Vrefp/8 or Vrefn/8; coupling a bottom plate of a third negative offset correction capacitor selectably to Vcm, Vrefn/8 or Vrefp/8; coupling a bottom plate of a fourth positive offset correction capacitor selectably to Vcm, Vrefp/16 or Vrefn/16; coupling a bottom plate of a fourth negative offset correction capacitor selectably to Vcm, Vrefn/16 or Vrefp/16; coupling a bottom plate of a fifth positive offset correction capacitor selectably to Vcm, Vrefp/32 or Vrefn/32; and coupling a bottom plate of a fifth negative offset correction capacitor selectably to Vcm, Vrefn/32 or Vrefp/32, whereby the offset compensation voltage may be created.

According to a further embodiment of the method, N may be equal to six (6) and may further comprise the steps of: coupling a top plate of a sixth positive offset correction capacitor to the node Vx; coupling a top plate of a sixth negative offset correction capacitor to the node Vy; coupling a bottom plate of the sixth positive offset correction capacitor selectably to Vcm, Vrefp or Vrefn; and coupling a bottom plate of the sixth negative offset correction capacitor selectably to Vcm, Vrefn or Vrefp, whereby the voltage offset correction range may be doubled.

According to a further embodiment of the method, may comprise the step of coupling the bottom plates of the positive and negative offset correction capacitors to the common mode voltage Vcm during a sampling phase of the SAR ADC. According to a further embodiment of the method, may comprise the step of disabling the offset compensation voltage. According to a further embodiment of the method, may comprise the step of doing offset correction upon start-up. According to a further embodiment of the method, may comprise the step of doing offset correction periodically. According to a further embodiment of the method, the SAR ADC may be a differential input SAR ADC.

According to another embodiment, a method for correcting for an offset voltage in an analog-to-digital converter (ADC) may comprise the steps of: coupling together inputs of an ADC to create an offset voltage; converting the offset voltage into a digital representation thereof; storing the digital representation of the offset voltage in an offset register; deriving an offset compensation voltage from the stored digital representation of the offset voltage stored in the offset register; receiving an input analog voltage; correcting for the offset voltage by scaling voltage of a least-significant-bit; and converting the input analog voltage to a digital output value. According to a further embodiment, the SAR ADC may be a differential input SAR ADC.

According to yet another embodiment, an analog-to-digital converter (ADC) may comprise circuitry configured to: couple together inputs of an ADC to create an offset voltage; convert the offset voltage into a digital representation thereof; store the digital representation of the offset voltage in an offset register; derive an offset compensation voltage from the stored digital representation of the offset voltage in the offset register; receive an analog voltage; convert the analog voltage to a digital value; and correct for the offset voltage by scaling reference voltages to a reduced capacitor array digital-to-analog converter (DAC) associated with a least-significant-bit of the ADC. According to a further embodiment, the ADC may be part of a microcontroller integrated circuit.

According to still another embodiment, apparatus for offset correction in a successive approximation register (SAR) analog-to-digital converter (ADC) using a reduced capacitor array digital-to-analog converter (DAC) may comprise: a SAR ADC comprising: inputs for a positive voltage Vinp and a negative voltage Vinn, a positive reference voltage Vrefp and a negative reference voltage Vrefn, and a common mode voltage Vcm; a first plurality of binary weighted capacitors having top plates coupled together to form a node Vx; a second plurality of binary weighted capacitors having top plates coupled together to form a node Vy; a plurality of first switches adapted for selectably coupling the bottom plates of the first plurality of binary weighted capacitors to voltages Vrefp, Vrefn, Vcm, and Vinp; a plurality of second switches adapted for selectably coupling the bottom plates of the second plurality of binary weighted capacitors to the voltages Vrefp, Vrefn, Vcm, and Vinn; a reduced capacitor array DAC comprising: N positive offset correction capacitors having top plates coupled to the node Vx, N negative offset correction capacitors having top plates coupled to the node Vy, a plurality of third switches adapted for selectably coupling bottom plates of the N positive offset correction capacitors to Vcm and a plurality of scaled voltage references $Vrefp/2^m$ and $Vrefn/2^m$, where m may be a positive integer; and a plurality of fourth switches adapted for selectably coupling bottom plates of the N negative offset correction capacitors to Vcm and the plurality of scaled voltage references $Vrefn/2^m$ and $Vrefp/2^m$, where m may be a positive integer.

According to a further embodiment, N may be equal to five (5) and may comprise: the bottom plate of a first positive offset correction capacitor may be selectably coupled to Vcm, Vrefp/2 or Vrefn/2; the bottom plate of a first negative offset correction capacitor may be selectably coupled to Vcm, Vrefn/2 or Vrefp/2; the bottom plate of a second positive offset correction capacitor may be selectably coupled to Vcm, Vrefp/4 or Vrefn/4; the bottom plate of a second negative offset correction capacitor may be selectably coupled to Vcm, Vrefn/4 or Vrefp/4; the bottom plate of a third positive offset correction capacitor may be selectably coupled to Vcm, Vrefp/8 or Vrefn/8; the bottom plate of a third negative offset correction capacitor may be selectably coupled to Vcm, Vrefn/8 or Vrefp/8; the bottom plate of a fourth positive offset correction capacitor may be selectably coupled to Vcm, Vrefp/16 or Vrefn/16; the bottom plate of a fourth negative offset correction capacitor may be selectably coupled to Vcm, Vrefn/16 or Vrefp/16; the bottom plate of a fifth positive offset correction capacitor may be selectably coupled to Vcm, Vrefp/32 or Vrefn/32; and the bottom plate of a fifth negative offset correction capacitor may be selectably coupled to Vcm, Vrefn/32 or Vrefp/32, whereby the offset compensation voltage may be created.

According to a further embodiment, N may be equal to six (6) and may additionally comprise: the top plate of a sixth positive offset correction capacitor may be coupled to the node Vx; the top plate of a sixth negative offset correction capacitor may be coupled to the node Vy, e bottom plate of the sixth positive offset correction capacitor may be selectably coupled to Vcm, Vrefp or Vrefn; and the bottom plate of the sixth negative offset correction capacitor may be selectably coupled to Vcm, Vrefn or Vrefp; whereby the voltage offset correction range may be doubled. According to a further embodiment of the method, the SAR ADC may be a differential input SAR ADC.

BRIEF DESCRIPTION OF THE DRAWINGS

A more complete understanding of the present disclosure may be acquired by referring to the following description taken in conjunction with the accompanying drawings wherein.

Figure 1:
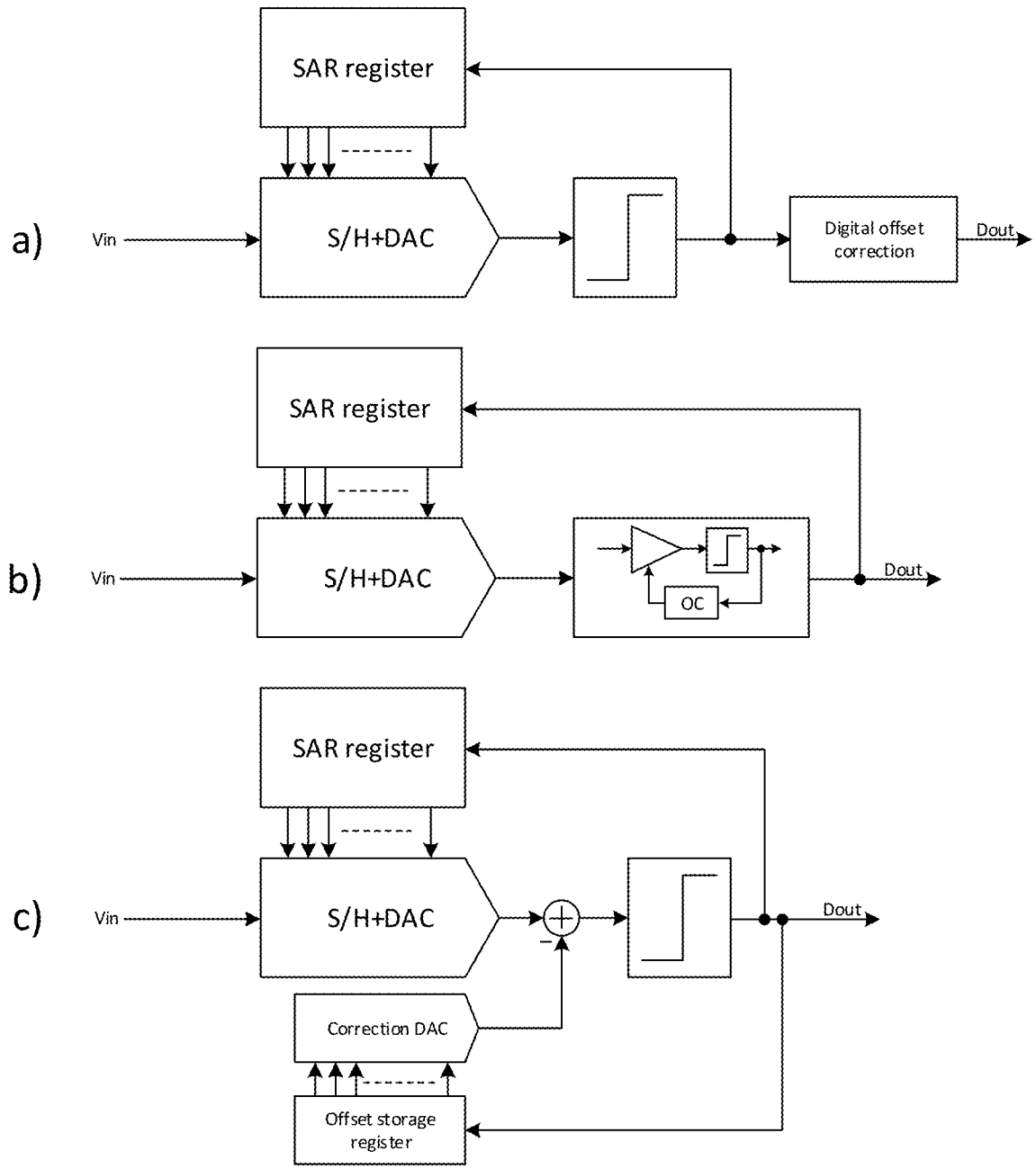
FIG. 1 illustrates schematic diagrams of three prior technology methods to perform offset correction.

While the present disclosure is susceptible to various modifications and alternative forms, specific example embodiments thereof have been shown in the drawings and are herein described in detail. It should be understood, however, that the description herein of specific example embodiments is not intended to limit the disclosure to the forms disclosed herein.

DETAILED DESCRIPTION

Embodiments of the present disclosure include a hybrid analog/digital correction exploiting capacitor-reduced DAC topology to enable offset correction without the need for a dedicated compensation DAC. Embodiments of the present disclosure may use a DAC topology called capacitor-reduced DAC. Some ADC's are not calibrated since they only do relative measurements and offset, and absolute gain is not of importance. Embodiments of the present disclosure may adapt the topology architecture for general microcontroller use. Accordingly, embodiments of the present disclosure may add the possibility to calibrate the offset and gain of the ADC or not. The proposed solution, according to embodiments of the present disclosure, provides hybrid digital/analog offset correction without limiting the range of the ADC and removes the need for a separate correction DAC.

The capacitor-reduced DAC topology circuit disclosed and claimed herein may be easily implemented into an integrated circuit device such as, for example but not limited to, a mixed signal (both analog and digital circuits) microcontroller.

Referring now to the drawings, the details of example embodiments are schematically illustrated. Like elements in the drawings will be represented by like numbers, and similar elements will be represented by like numbers with a different lower-case letter suffix.

Figure 2:
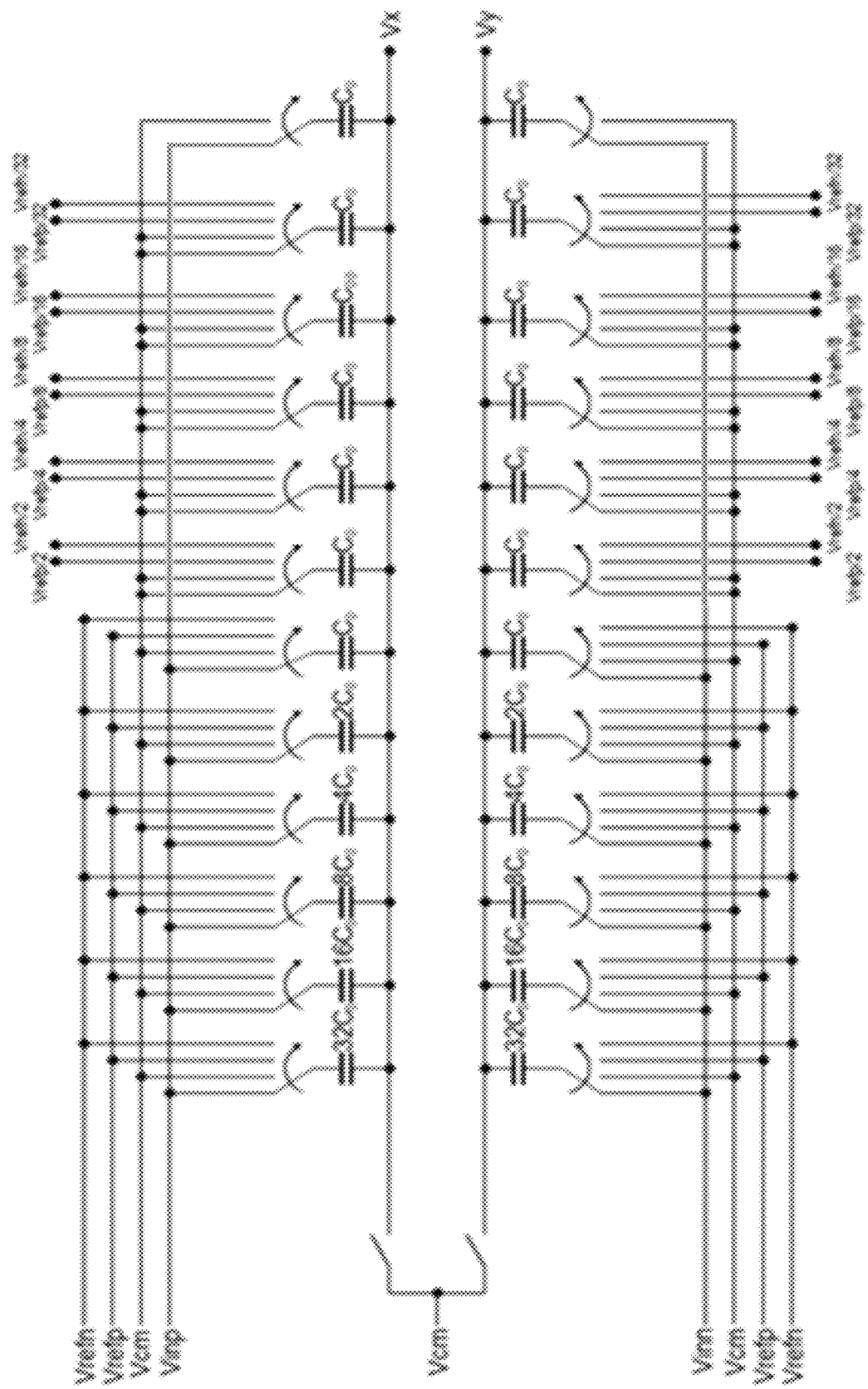
FIG. 2 illustrates a schematic diagram of a reduced capacitor array DAC, according to embodiments of the present disclosure.
Figure 2A:
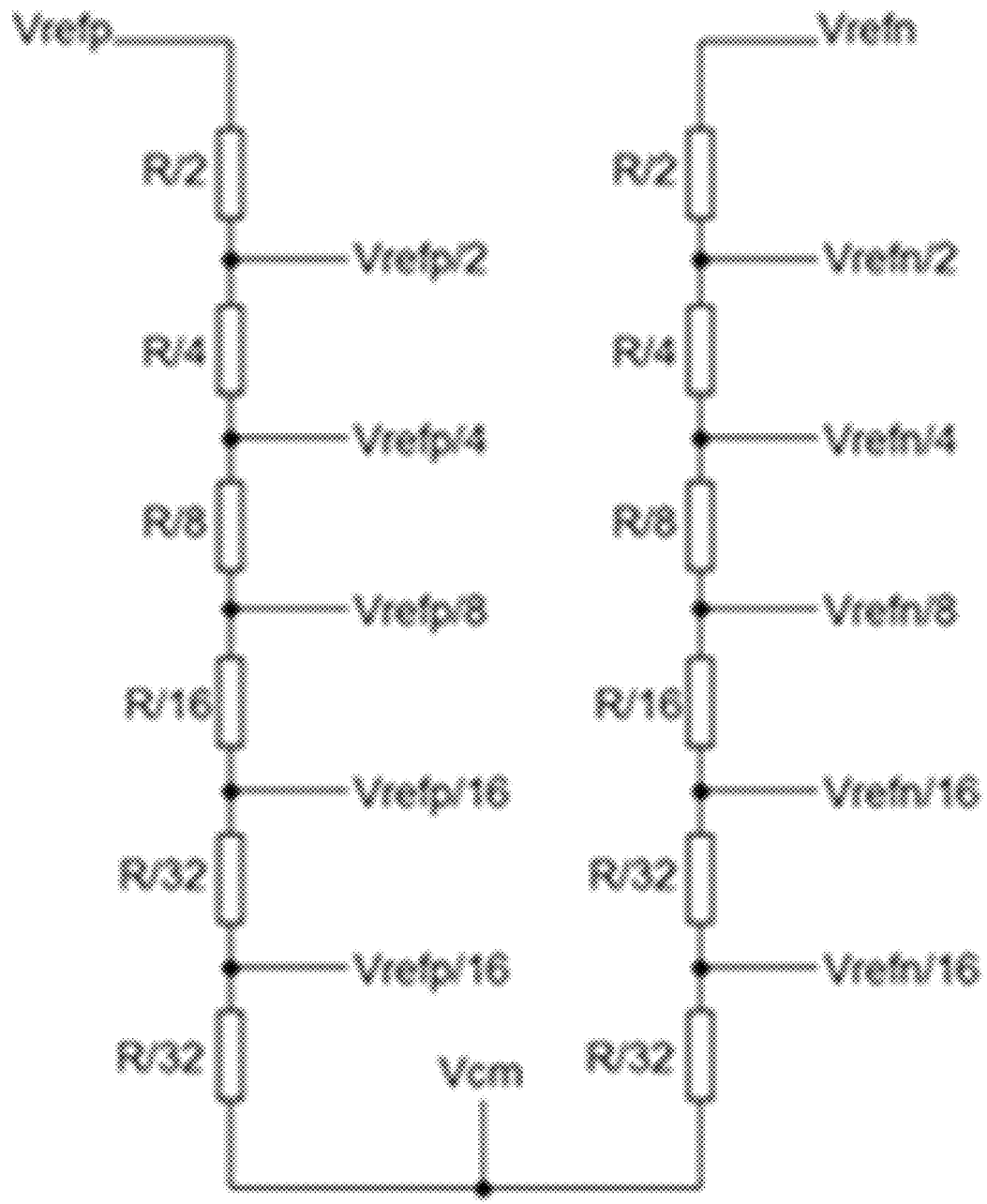
FIG. 2A illustrates a schematic diagram of a resistance voltage divider to scale reference voltages for the reduced capacitor array DAC shown in FIG. 2, according to embodiments of the present disclosure.

Referring to FIG. 2, depicted is a schematic diagram of a reduced capacitor array DAC, according to embodiments of the present disclosure. ADC's used with a reduced capacitor array DAC may be more effective than a split capacitor array. The capacitor-reduced array for a 12-bit Vcm-based differential input SAR ADC is shown in FIG. 2. It is a charge redistribution ADC with a capacitive DAC, but instead of scaling the lower bits by using dedicated scaling capacitors, they are scaled by dividing the reference voltage and using the scaled reference voltages (FIG. 2A) to produce a charge relation of Q=C*·V, which is equivalent for charge redistribution operation. Scaling V instead of C means unit capacitors, which are reasonably large, can be used and still achieve a small total capacitance, which is beneficial for area, power consumption, and the load the capacitor array represents for the input signal and reference voltage buffer.

To maintain a correct transfer function for the ADC, where the MSB should represent half of the total signal range, the input is only sampled on double the MSB capacitance, or 64·$C_0$ in the DAC shown in FIG. 2. The remaining five unit capacitors that operate on scaled references, all have both sides connected to Vcm during sampling, meaning they are free of charge.

In FIG. 2 it is seen that the input is sampled on 64$C_0$ (all sampling capacitors coupled together: 32$C_0$+16$C_0$+8$C_0$+4$C_0$+2$C_0$+$C_0$+$C_0$) in the sampling phase, while the capacitors for the five lowest bits are connected to Vcm, whereby they are free of charge. When the ADC goes from the sampling phase to the MSB decision phase, the input sampling capacitors are switched to Vcm, shifting the input voltages to nodes Vx and Vy by charge redistribution. The ADC then does the MSB decision depending on whether Vx>Vy or Vx<Vy. The 32·$C_0$ capacitors are then switched to Vrefp/Vrefn or Vrefn/Vrefp depending on the MSB decision, and then Vx and Vy are evaluated again to get the MSB-1 decision. This process continues until the successive approximation analog-to-digital conversion is complete and all bits are converted.

However, since the capacitors for the five lower bits are not used during sampling, it is possible to use these to do five-bit offset correction. If these capacitors are held at their divided Vrefp voltages at the Vx side and divided Vrefn voltages at the Vy side, the difference between Vx and Vy is shifted 32 LSB's upwards. And if they are switched opposite, the difference between Vx and Vy is shifted 32 LSB's downwards. This means that if the switching of these five capacitors during the sampling phase is controlled, we get a 5-bit offset correction DAC with ±1 LSB resolution for free. This means we only need a 5-bit offset storage register to control these five bits during sampling, in order to have a 5-bit offset correction, as shown conceptually in FIG. 3. If correctly measured the offset may thus be reduced to within ±1 LSB.

During the sample phase, the LSB-part of DAC can be connected to reference voltages instead of Vcm to shift transfer function. Connecting one unit element pair to pos/neg reference will shift transfer function one LSB upwards, connecting it in the opposite—to neg/pos reference shifts it one LSB downwards. Offset may be measured then store in a register used to control «LSB-part» during sampling. Connect capacitor pairs to pos/neg or neg/pos reference according to result stored in offset storage register. Thus LSB-part can act as compensation DAC without adding analog circuitry. Switch control logic and offset storage register is the only additional circuit cost required.

Figure 3:
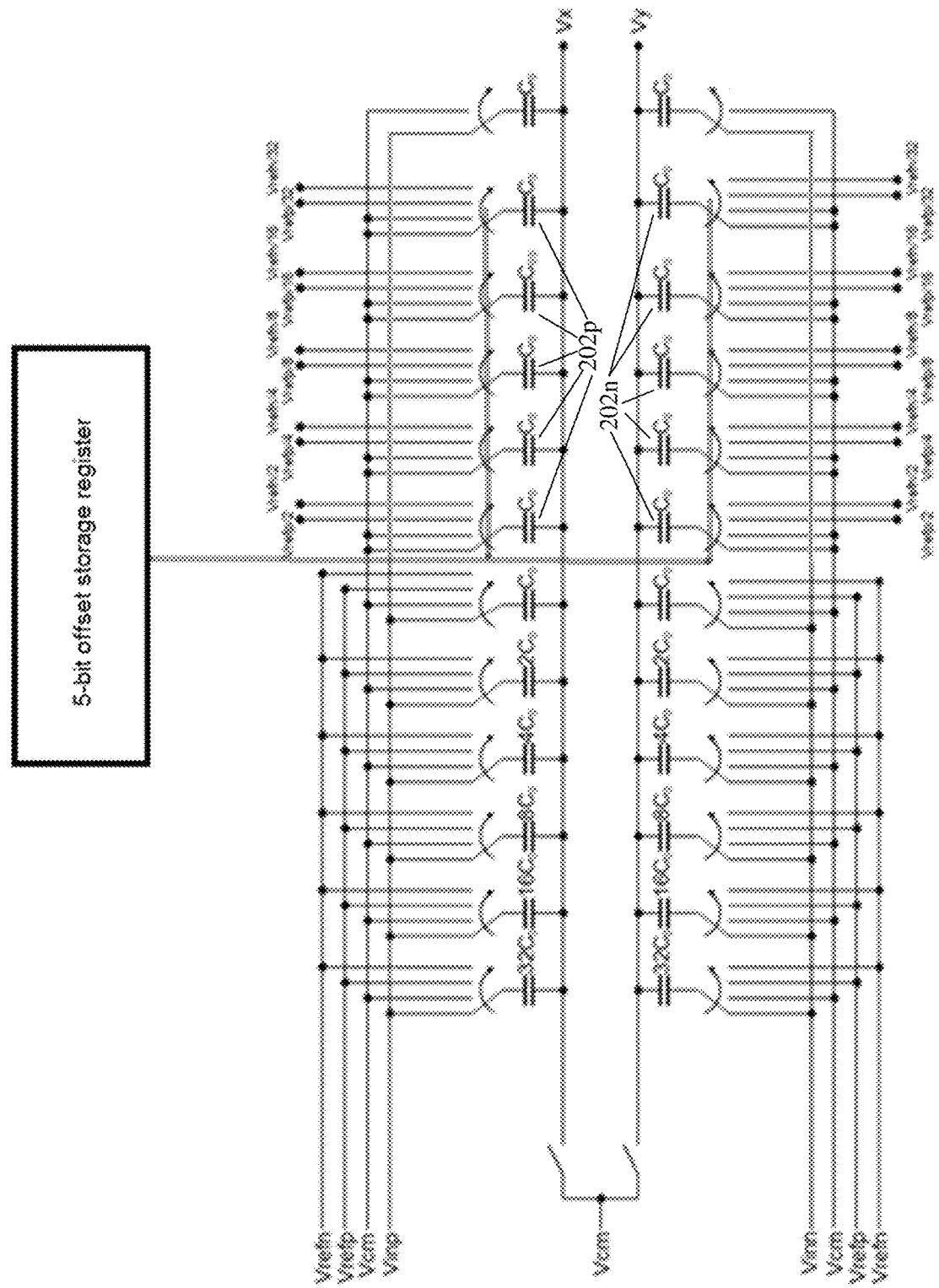
FIG. 3 illustrates a schematic diagram of the reduced capacitor DAC shown in FIG. 2 when used as a sample-and-hold (S/H) and offset correction DAC during sampling, according to specific example embodiments of this disclosure.

Referring to FIG. 3, depicted is a schematic diagram of the reduced capacitor DAC shown in FIG. 2 when used as a sample-and-hold (S/H) and offset correction DAC during sampling, according to specific example embodiments of this disclosure. The capacitors 202, comprising the offset compensation ADC, may be coupled to either positive or negative scaled reference voltages (FIG. 2A) depending upon the offset compensation direction required.

Figure 4:
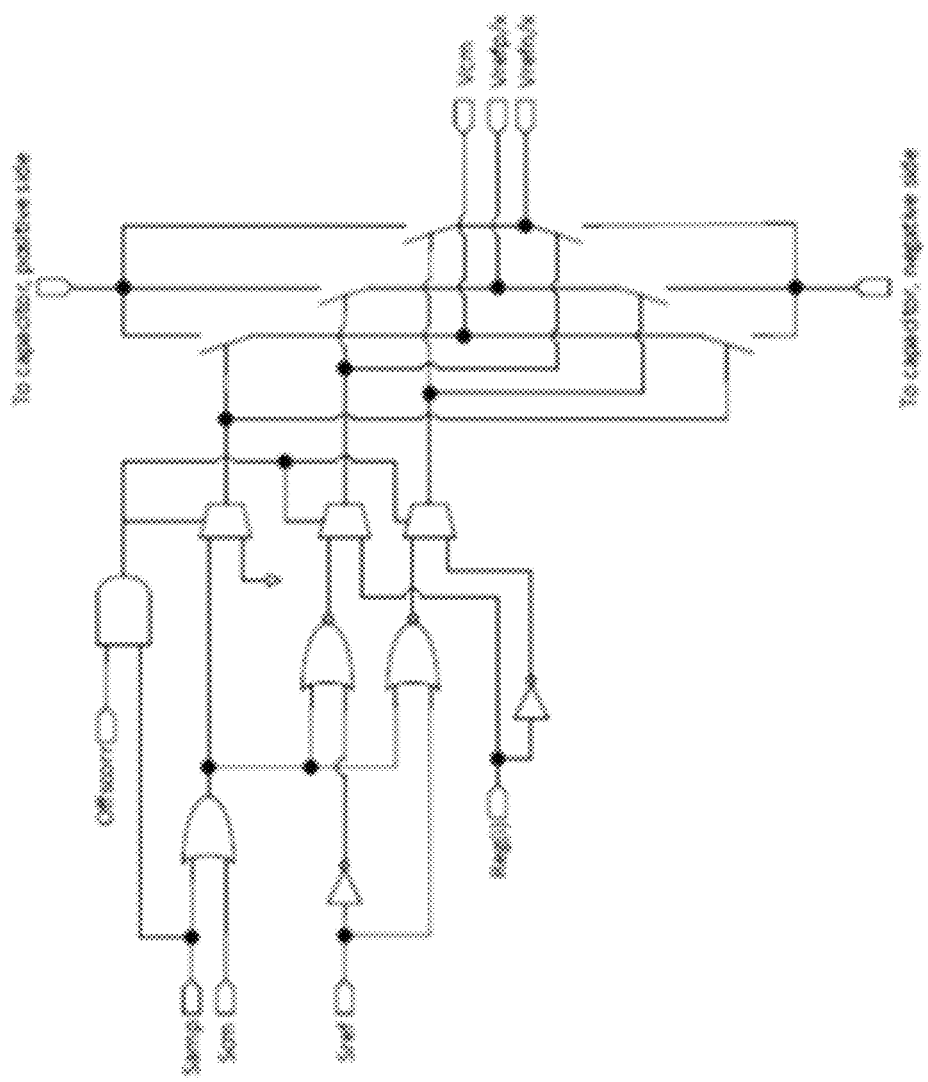
FIG. 4 illustrates a schematic diagram of switch control logic for coupling offset correction capacitors to inputs and reference voltages, according to specific example embodiments of this disclosure.

Referring to FIG. 4, depicted is a schematic diagram of switch control logic for coupling offset correction capacitors to inputs and reference voltages, according to specific example embodiments of this disclosure. This may be an implementation of the switch control for the DAC with offset correction. Here the input signal offscorr is used to turn offset correction on or off. If offset correction is off (offscorr=0), then control is as usual (in a capacitor reduced DAC without any offset correction), connecting the capacitors to Vcm during both the sampling phase (samp=1) and the Vcm-phase (scm=1), and switching the capacitors to Vrefp/Vrefn or Vrefn/Vrefp during the bit decision phase, depending on the result of the previous decision (sref high or low). When offset correction is on (offscorr=1), then the capacitors are connected to Vrefp/Vrefn or Vrefn/Vrefp instead of Vcm when samp=1, depending on the value of reg(i) which is the i'th bit of the offset storage register. This means with five such switches and a 5-bit offset storage register the control as shown in FIG. 3 may be implemented. The additional cost compared to a switch control logic without offset correction is three 2-1 multiplexers, one AND-gate and one inverter per bit calibration. In addition, one 5-bit register may be used to store the offset bit control configuration. No additional analog hardware is required, according to the teachings of this disclosure.

Figure 5:
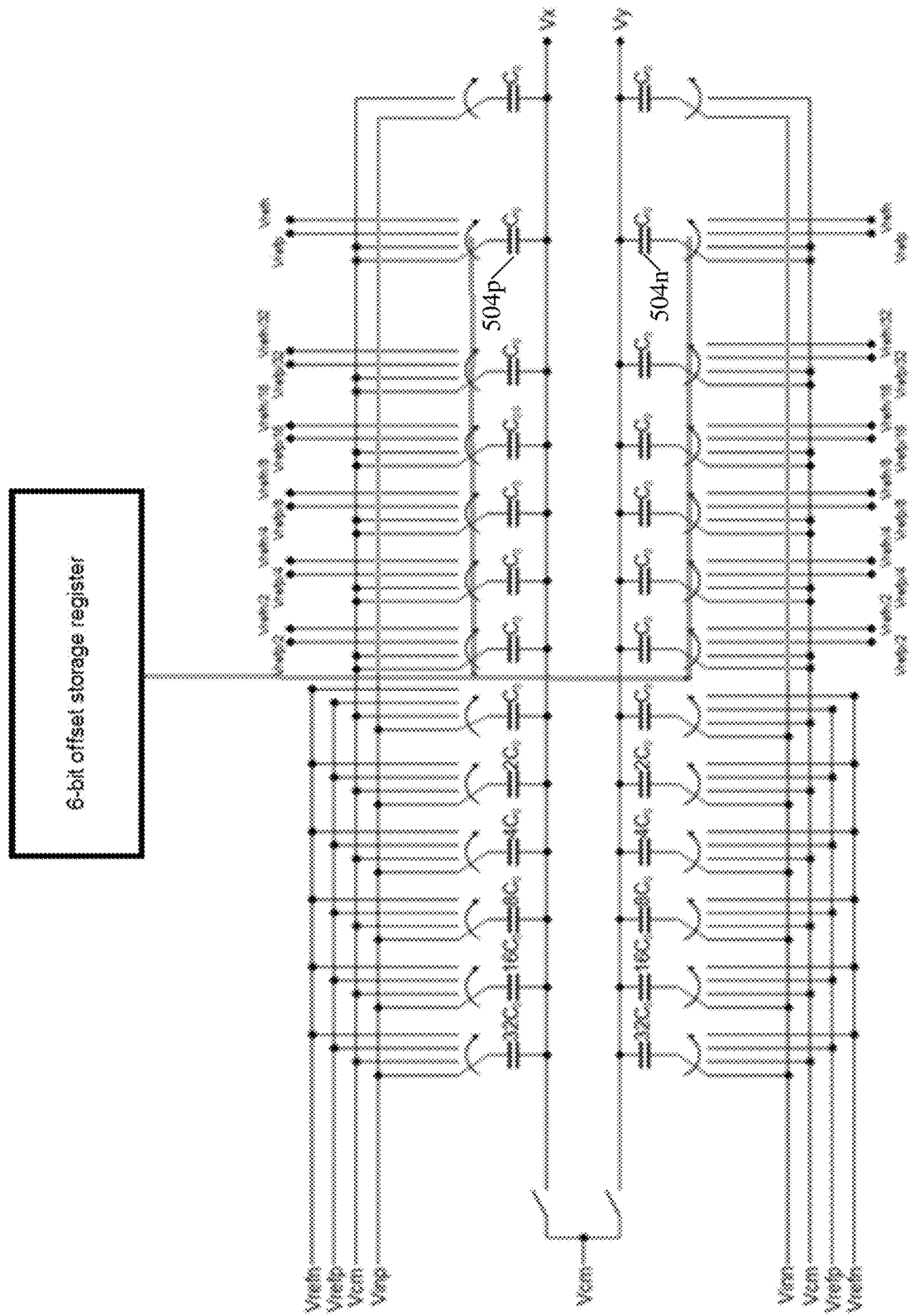
FIG. 5 illustrates a schematic diagram of a circuit for doubling the range of offset correction, according to specific example embodiments of this disclosure.

Referring to FIG. 5, depicted is a schematic diagram of a circuit for doubling the range of offset correction, according to specific example embodiments of this disclosure. The range of offset correction may be doubled by adding an additional unit capacitor per side, e.g., $C_0$ 504p and $C_0$ 504n. It is also possible, and contemplated herein, to extend the range of the offset calibration with very little cost in analog hardware. Since the part of the DAC used for offset correction uses scaled references, only one extra unit capacitor is required to be connected to the full reference voltage, Vref, to double the offset correction range. Thus, adding two $C_0$ capacitors connected to the full references Vrefp and Vrefn, will provide for another bit of calibration. Extending the range of offset correction from ±32 LSB's to ±64 LSB's is shown in FIG. 5. The resolution will still be ±1 LSB which is the fundamental resolution of this correction scheme.

Figure 6:
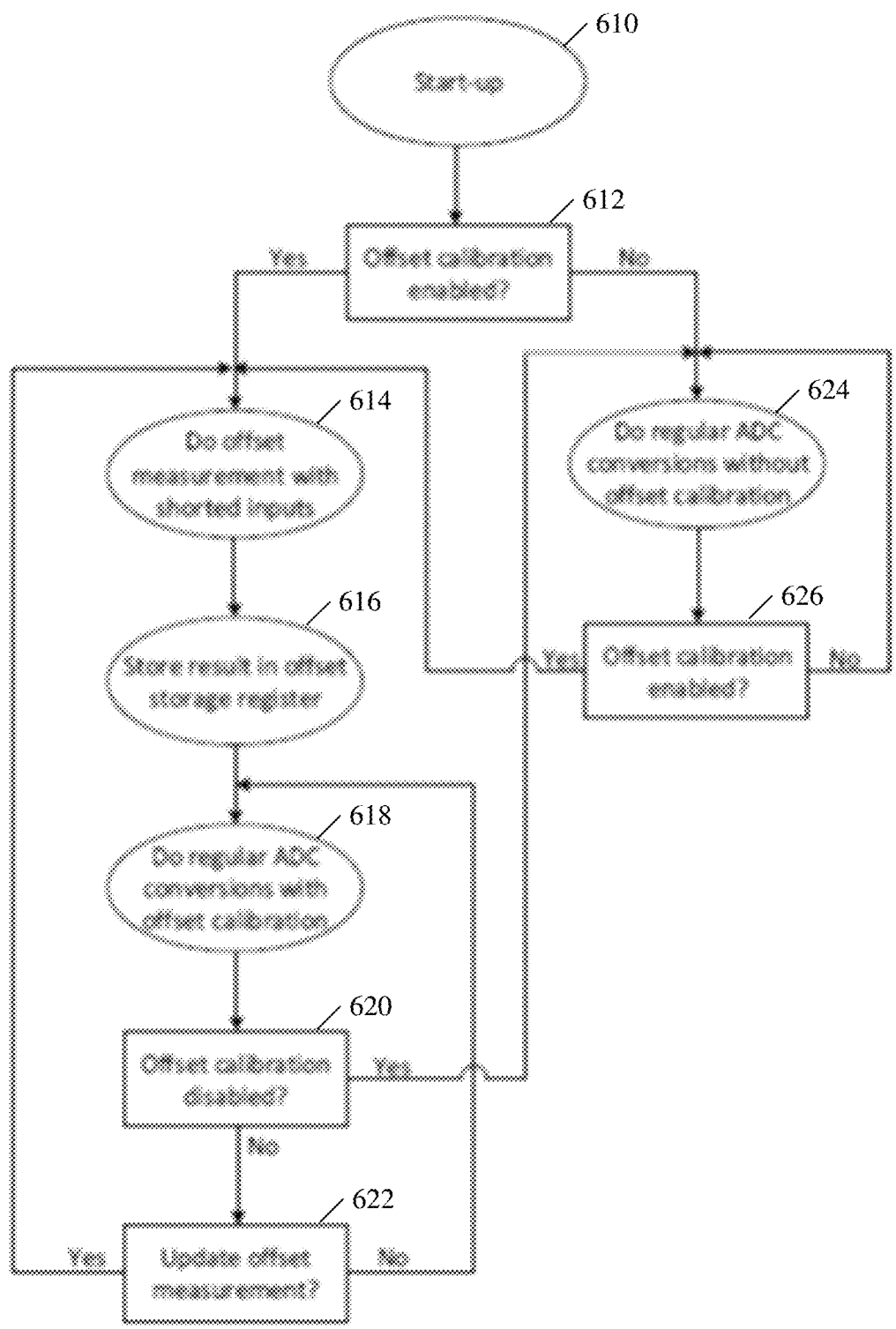
FIG. 6 illustrates a schematic flow diagram for operation of an ADC with hybrid offset calibration, according to specific example embodiments of this disclosure.

Referring to FIG. 6, depicted is a schematic flow diagram for operation of an ADC with hybrid offset calibration, according to specific example embodiments of this disclosure. Like with a digital calibration or conventional hybrid calibration scheme, it is necessary to do an ADC conversion to measure the offset and store it in the offset storage register. This means that the ADC must be taken out of operation for one conversion period in order to do an offset measurement. Typically, the offset will be measured at start-up, and if an offset adjustment is needed done at that time. Updated offset measurements and offset adjustments to compensate for circuit drift, e.g., temperature variations may be done at given intervals. If offset calibration is not needed the functionality can simply be turned off. An offset measurement is typically done by shorting the ADC inputs together and a dedicated offset calibration signal may be used to ensure the result is loaded into the offset measurement register. The offset measurement register may then be used to control the DAC switches (FIG. 4) when doing normal SAR analog-to-digital conversions thereafter.

The offset calibration process begins with step 610. Upon system start-up or periodically, e.g., to compensate for component temperature drift, an offset calibration bit level may be determined in step 612. If the calibration bit is not set to "offset calibrate" then a normal ADC conversion is performed in step 624. After each ADC conversion in step 624, a check is made if offset calibration has been enabled in step 626. If the calibration bit is not set to "offset calibrate" then another ADC conversion in step 624 is performed.

However, if it is determined in step 612 or 626 that the calibration bit is set to "offset calibrate" then in step 614 an offset measurement is made with the inputs of the ADC shorted together. In step 616, the result of the offset measurement is stored in an offset storage register. In step 618 regular SAR ADC conversions are performed with the offset calibration DAC capacitors coupled to the appropriate selected (from offset storage register) reference voltages. In step 620 the offset calibration bit level is checked and if the offset calibration has been disabled then return to step 624. If the offset calibration bit is still enabled, then return to step 614 to do a new offset calibration before doing the next SAR ADC conversion.

It is contemplated and within the scope of this disclosure that the offset compensating SAR ADC may be implemented with bitcells to control DAC switching, according to embodiments of the present disclosure. This may include adding logic in bitcells of the LSB-part to switch to positive or negative references during sampling. This may include three 2:1 multiplexers and one inverter extra in each bitcell. This may switch correction on or off. Furthermore, there may be a storage register for N-bit correction that includes a plurality (N) of digital decimation filter (DDF) digital signal processing (DSP) filters that may be used in high-resolution ADCs. Thus, an N-bit offset correction DAC may be achieved.

FIG. 10 illustrates simulation results of embodiments of the present disclosure. FIG. 10 illustrates simulated offset (transistor level) with correction on and off.

Embodiments of the present disclosure may enable hybrid offset correction without a dedicated compensation DAC. Embodiments of the present disclosure may correct offset to +/−1 LSB. Embodiments of the present disclosure do not limit ADCs input range. Embodiments of the present disclosure do not require additional analog circuitry. Embodiments of the present disclosure may measure and store offset compensation values required to compensate for offsets during the analog-to-digital conversion. This may be performed at start-up or at repeated intervals.

The present disclosure has been described in terms of one or more embodiments, and it should be appreciated that many equivalents, alternatives, variations, and modifications, aside from those expressly stated, are possible and within the scope of the disclosure. While the present disclosure is susceptible to various modifications and alternative forms, specific example embodiments thereof have been shown in the drawings and are herein described in detail. It should be understood, however, that the description herein of specific example embodiments is not intended to limit the disclosure to the particular forms disclosed herein.

What is claimed is:

1. A method for offset correction in a successive approximation register (SAR) analog-to-digital converter (ADC) using a reduced capacitor array digital-to-analog converter (DAC), said method comprising the steps of:
   coupling together positive and negative inputs of a SAR ADC;
   determining a digital representation of an offset voltage of the SAR DAC;
   storing the digital representation of the offset voltage in an offset register;
   configuring a reduced capacitor array DAC, comprising a plurality of offset correction capacitors, with the stored digital representation of the input offset voltage to provide an offset correction voltage;
   decoupling the positive and negative inputs of the SAR ADC;

coupling a differential voltage to the positive and negative inputs of the SAR ADC; and performing a SAR conversion of the differential voltage while coupling with the offset correction voltage from the reduced capacitor array DAC.

2. The method according to claim 1, wherein the plurality of offset correction capacitors are coupled to a plurality of reference voltages selected by the digital representation of the offset voltage stored in the offset register.

3. The method according to claim 2, wherein the plurality of reference voltages are binary weighted from Vrefp to Vrefn voltages.

4. The method according to claim 3, wherein a common mode voltage Vcm is about equal to (Vrefp+Vrefn)/2.

5. The method according to claim 3, wherein the plurality of reference voltages are provided from a series connected resistive voltage divider string coupled between Vrefp and Vrefn.

6. The method according to claim 1, wherein the plurality of offset correction capacitors comprises N positive offset correction capacitors having top plates coupled together and forming a node Vx, and N negative offset correction capacitors having top plates coupled together and forming a node Vy, where N is the number of offset voltage correction bits of the reduced capacitor array DAC.

7. The method according to claim 6, wherein N is equal to five (5) and further comprising the steps of:

coupling a bottom plate of a first positive offset correction capacitor selectably to Vcm, Vrefp/2 or Vrefn/2;

coupling a bottom plate of a first negative offset correction capacitor selectably to Vcm, Vrefn/2 or Vrefp/2;

coupling a bottom plate of a second positive offset correction capacitor selectably to Vcm, Vrefp/4 or Vrefn/4;

coupling a bottom plate of a second negative offset correction capacitor selectably to Vcm, Vrefn/4 or Vrefp/4;

coupling a bottom plate of a third positive offset correction capacitor selectably to Vcm, Vrefp/8 or Vrefn/8;

coupling a bottom plate of a third negative offset correction capacitor selectably to Vcm, Vrefn/8 or Vrefp/8;

coupling a bottom plate of a fourth positive offset correction capacitor selectably to Vcm, Vrefp/16 or Vrefn/16;

coupling a bottom plate of a fourth negative offset correction capacitor selectably to Vcm, Vrefn/16 or Vrefp/16;

coupling a bottom plate of a fifth positive offset correction capacitor selectably to Vcm, Vrefp/32 or Vrefn/32; and coupling a bottom plate of a fifth negative offset correction capacitor selectably to Vcm, Vrefn/32 or Vrefp/32, whereby the offset compensation voltage is created.

8. The method according to claim 6, wherein N is equal to six (6) and further comprising the steps of:

coupling a top plate of a sixth positive offset correction capacitor to the node Vx;

coupling a top plate of a sixth negative offset correction capacitor to the node Vy;

coupling a bottom plate of the sixth positive offset correction capacitor selectably to Vcm, Vrefp or Vrefn; and coupling a bottom plate of the sixth negative offset correction capacitor selectably to Vcm, Vrefn or Vrefp, whereby the voltage offset correction range is doubled.

9. The method according to claim 1, further comprising the step of coupling the bottom plates of the positive and negative offset correction capacitors to the common mode voltage Vcm during a sampling phase of the SAR ADC.

10. The method according to claim 1, further comprising the step of disabling the offset compensation voltage.

11. The method according to claim 1, further comprising the step of doing offset correction upon start-up.

12. The method according to claim 1, further comprising the step of doing offset correction periodically.

13. The method according to claim 1, wherein the SAR ADC is a differential input SAR ADC.

14. A method for correcting for an offset voltage in an analog-to-digital converter (ADC), comprising the steps of:

coupling together inputs of an ADC to create an offset voltage;

converting the offset voltage into a digital representation thereof;

storing the digital representation of the offset voltage in an offset register;

deriving an offset compensation voltage from the stored digital representation of the offset voltage stored in the offset register;

receiving an input analog voltage;

correcting for the offset voltage by scaling voltage of a least-significant-bit; and converting the input analog voltage to a digital output value;

wherein the SAR ADC is a differential input SAR ADC.

15. An analog-to-digital converter (ADC), comprising circuitry configured to:

couple together inputs of an ADC to create an offset voltage;

convert the offset voltage into a digital representation thereof;

store the digital representation of the offset voltage in an offset register;

derive an offset compensation voltage from the stored digital representation of the offset voltage in the offset register;

receive an analog voltage;

convert the analog voltage to a digital value; and correct for the offset voltage by scaling reference voltages to a reduced capacitor array digital-to-analog converter (DAC) associated with a least-significant-bit of the ADC.

16. The ADC according to claim 15, wherein the ADC is part of a microcontroller integrated circuit.

17. An apparatus for offset correction in a successive approximation register (SAR) analog-to-digital converter (ADC) using a reduced capacitor array digital-to-analog converter (DAC), said apparatus comprising:

a SAR ADC comprising:

inputs for a positive voltage Vinp and a negative voltage Vinn, a positive reference voltage Vrefp and a negative reference voltage Vrefn, and a common mode voltage Vcm;

a first plurality of binary weighted capacitors having top plates coupled together to form a node Vx;

a second plurality of binary weighted capacitors having top plates coupled together to form a node Vy;

a plurality of first switches adapted for selectably coupling the bottom plates of the first plurality of binary weighted capacitors to voltages Vrefp, Vrefn, Vcm, and Vinp;

a plurality of second switches adapted for selectably coupling the bottom plates of the second plurality of binary weighted capacitors to the voltages Vrefp, Vrefn, Vcm, and Vinn;

a reduced capacitor array DAC comprising:
- N positive offset correction capacitors having top plates coupled to the node Vx,
- N negative offset correction capacitors having top plates coupled to the node Vy,
- a plurality of third switches adapted for selectably coupling bottom plates of the N positive offset correction capacitors to Vcm and a plurality of scaled voltage references Vrefp/$2^m$ and Vrefn/$2^m$, where m is a positive integer; and
- a plurality of fourth switches adapted for selectably coupling bottom plates of the N negative offset correction capacitors to Vcm and the plurality of scaled voltage references Vrefn/$2^m$ and Vrefp/$2^m$, where m is a positive integer.

18. The apparatus according to claim 17, wherein N is equal to five (5) and comprises:
- the bottom plate of a first positive offset correction capacitor is selectably coupled to Vcm, Vrefp/2 or Vrefn/2;
- the bottom plate of a first negative offset correction capacitor is selectably coupled to Vcm, Vrefn/2 or Vrefp/2;
- the bottom plate of a second positive offset correction capacitor is selectably coupled to Vcm, Vrefp/4 or Vrefn/4;
- the bottom plate of a second negative offset correction capacitor is selectably coupled to Vcm, Vrefn/4 or Vrefp/4;
- the bottom plate of a third positive offset correction capacitor is selectably coupled to Vcm, Vrefp/8 or Vrefn/8;
- the bottom plate of a third negative offset correction capacitor is selectably coupled to Vcm, Vrefn/8 or Vrefp/8;
- the bottom plate of a fourth positive offset correction capacitor is selectably coupled to Vcm, Vrefp/16 or Vrefn/16;
- the bottom plate of a fourth negative offset correction capacitor is selectably coupled to Vcm, Vrefn/16 or Vrefp/16;
- the bottom plate of a fifth positive offset correction capacitor is selectably coupled to Vcm, Vrefp/32 or Vrefn/32; and
- the bottom plate of a fifth negative offset correction capacitor is selectably coupled to Vcm, Vrefn/32 or Vrefp/32, whereby the offset compensation voltage is created.

19. The apparatus according to claim 18, wherein N is equal to six (6) and further comprises:
- the top plate of a sixth positive offset correction capacitor is coupled to the node Vx;
- the top plate of a sixth negative offset correction capacitor is coupled to the node Vy,
- the bottom plate of the sixth positive offset correction capacitor is selectably coupled to Vcm, Vrefp or Vrefn; and
- the bottom plate of the sixth negative offset correction capacitor is selectably coupled to Vcm, Vrefn or Vrefp;

whereby the voltage offset correction range is doubled.

20. The method according to claim 17, wherein the SAR ADC is a differential input SAR ADC.

* * * * *